United States Patent
Kim et al.

(10) Patent No.: US 7,250,653 B2
(45) Date of Patent: Jul. 31, 2007

(54) SONOS MEMORY DEVICE HAVING NANO-SIZED TRAP ELEMENTS

(75) Inventors: Ju-hyung Kim, Yongin-si (KR); Chung-woo Kim, Seongnam-si (KR); Soo-doo Chae, Seongnam-si (KR); Youn-seok Jeong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/849,446

(22) Filed: May 20, 2004

(65) Prior Publication Data
US 2004/0232478 A1  Nov. 25, 2004

(30) Foreign Application Priority Data
May 20, 2003 (KR) .................. 10-2003-0031909

(51) Int. Cl.
*H01L 29/792* (2006.01)
(52) U.S. Cl. ........................................ 257/324
(58) Field of Classification Search ........ 257/314–324; 438/257–265
See application file for complete search history.

(56) References Cited

U.S. PATENT DOCUMENTS

| | | | |
|---|---|---|---|
| 5,714,766 A | 2/1998 | Chen et al. | |
| 6,208,000 B1 | 3/2001 | Tanamoto et al. | |
| 6,288,943 B1 | 9/2001 | Chi | |
| 6,444,545 B1 * | 9/2002 | Sadd et al. | 438/257 |
| 6,690,059 B1 * | 2/2004 | Lojek | 257/321 |
| 2002/0076850 A1 | 6/2002 | Sadd et al. | |

FOREIGN PATENT DOCUMENTS

| | | |
|---|---|---|
| EP | 0 843 361 | 5/1998 |
| WO | WO 02/03430 | 1/2002 |

* cited by examiner

*Primary Examiner*—Cuong Nguyen
(74) *Attorney, Agent, or Firm*—Lee & Morse, P.C.

(57) ABSTRACT

A silicon-oxide-nitride-oxide-silicon (SONOS) memory device includes a memory type transistor including a gate with a SONOS structure on a semiconductor substrate. The gate is formed by sequentially stacking a tunneling oxide layer, a memory node structure including a trap site having nano-sized trap elements in which charges passing through the tunneling oxide layer are trapped, and a gate electrode. The nano-sized trap elements may be a crystal layer composed of nanocrystals that are separated from one another to trap the charges. The memory node structure may include additional memory node layers which are isolated from the nano-sized trap elements.

5 Claims, 4 Drawing Sheets

SONOS MEMORY DEVICE HAVING NANO-SIZED TRAP ELEMENTS

BACKGROUND OF THE INVENTION

1. Field of the Invention

The present invention relates to a semiconductor memory device. More particularly, the present invention relates to a silicon-oxide-nitride-oxide-silicon (SONOS) memory device having nano-sized trap elements.

2. Description of the Related Art

The data storage capacity of a semiconductor memory device is proportional to the number of memory cells per unit area, i.e., the integration of the memory device. The semiconductor memory device includes a plurality of memory cells that are connected in a circuit.

In general, one memory cell of the semiconductor memory device, for example, a dynamic random access memory (DRAM), includes one transistor and one capacitor. Accordingly, in order to increase the integration of the semiconductor device, the size of the transistor and/or the capacitor should be reduced.

A semiconductor memory device having low integration has sufficient process margins in photolithographic and etch processes. Accordingly, reducing the size of the transistor and/or the capacitor could increase the integration of the semiconductor memory device.

As semiconductor technology and related electronic technology is improved, a semiconductor memory device having higher integration is required. However, reducing the size of the transistor and/or the capacitor alone cannot satisfy the requirement.

On the other hand, the integration of the semiconductor memory device is closely related to a design rule applied to the manufacturing process of the semiconductor memory device. Accordingly, in order to increase the integration of the semiconductor memory device, a strict design rule should be applied to the manufacturing process thereof, which results in the photolithographic and etch processes having low process margins. In other words, more precise photolithographic and etch processes should be applied to the manufacturing of a highly integrated semiconductor memory device.

When the margins of the photolithographic and etch processes in the manufacturing process of the semiconductor memory device are decreased, yield also decreases. Accordingly, a method of increasing the integration of the semiconductor memory device while preventing the corresponding decrease in the yield is needed.

Thus, a semiconductor memory device having a structure different from that of conventional semiconductor memory devices has been created in which the conventional capacitor has been replaced by other structures on the transistor. In these other structures, data are stored relying on different effects than that of the conventional capacitor. For example, these structures rely on a giant magneto resistance (GMR) effect or a tunneling magnetic resistance (TMR) effect. A silicon-oxide-nitride-oxide-silicon (SONOS) memory device is such a semiconductor memory device. FIG. 1 is cross-section of a conventional SONOS memory device.

Referring to FIG. 1, a conventional SONOS memory device includes a p-type semiconductor substrate 10, which will be referred to as a semiconductor substrate 10. A source region 12 and a drain region 14 doped with an n-type conductive impurity are formed in the semiconductor substrate 10. A channel region 16 exists between the source and drain regions 12 and 14. A tunneling oxide layer 18, which contacts the source and drain regions 12 and 14, is formed on the channel region 16 of the semiconductor substrate 10. A nitride layer ($Si_3N_4$) 20 and a blocking oxide layer 22 are sequentially deposited on the tunneling oxide layer 18. A gate electrode 24 is formed on the blocking oxide layer 22. The nitride layer 20 includes a trap site to trap electrons, which pass through the tunneling oxide layer 18. The blocking oxide layer 22 prevents the trapped electrons from flowing to the gate electrode 24.

The threshold voltage of the conventional SONOS memory device when the electrons are trapped in the trap site of the nitride layer 20 is different from the threshold voltage when the electrons are not trapped. The conventional SONOS memory device may store and reproduce information. However, the conventional SONOS memory device can store only one bit of information per cell. Accordingly, the size of the cells must be reduced to improve the integration of the conventional SONOS memory device.

To this end, the volume of the SONOS memory device of FIG. 1 should be reduced, which requires a strict design rule in the photolithographic process. However, it is difficult to strictly apply the design rule due to resolution limits of the photolithographic process.

As a result, while the conventional SONOS memory device may have higher integration than the semiconductor memory device formed of one transistor and one capacitor, the conventional SONOS memory device still has limited integration due to limitations of the photolithographic process.

SUMMARY OF THE INVENTION

The present invention is therefore directed to a SONOS memory device, which substantially overcomes one or more of the problems due to the limitations and disadvantages of the related art.

It is a feature of an embodiment of the present invention to provide a SONOS memory device storing a larger amount of data in a unit memory cell than in a conventional unit memory cell. It is another feature of an embodiment of the present invention to provide a SONOS memory device with increased integration.

At least one of the above and other features may be realized by providing a silicon-oxide-nitride-oxide-silicon (SONOS) memory device including a memory type transistor in which a gate is formed with a SONOS structure on a semiconductor substrate. The gate includes a tunneling oxide layer, a memory node structure formed on the tunneling oxide layer and having a trap site in which charges passing through the tunneling oxide layer are trapped, and a gate electrode formed on the memory node structure. The memory node structure includes a crystal layer having nanocrystals that are separated from one another to trap the charges.

The memory node structure may include a first memory node layer, a second memory node layer and a third memory node layer. At least one of the first through third memory node layers may include the crystal layer, with the crystal layer being isolated from adjacent memory node layers.

The first memory node layer may include the crystal layer and the third memory node layer may include another crystal layer, or the second memory node layer may include the crystal layer. The memory node layer including the crystal layer may further include an insulating layer interposed between the crystal layer and an adjacent memory node layer. The memory node layers that do not include the crystal layer may be a dielectric layer, e.g., a nitride layer, having a trap site with a predetermined density. The SONOS memory device may include a blocking oxide layer between the third memory node layer and the gate electrode.

At least one of the above and other features may be realized by providing a silicon-oxide-nitride-oxide-silicon (SONOS) memory device including a memory type transistor in which a gate is formed with a SONOS structure on a semiconductor substrate. The gate includes a tunneling oxide layer, a memory node structure formed on the tunneling oxide layer and having a trap site in which charges passing through the tunneling oxide layer are trapped, and a gate electrode formed on the memory node structure. The memory node layer includes a nano-sized trap element in which the charges are trapped.

The memory node structure may include a first memory node layer, a second memory node layer, and a third memory node layer. At least one of the first through third memory node layers includes the nano-sized trap element. The nano-sized trap element is isolated from adjacent memory node layers. The first memory node layer may include the nano-sized trap element and the third memory node layer may include another nano-sized trap element, or the second memory node layer may include the nano-sized trap element. The nano-sized trap element may be a crystal layer composed of nanocrystals that are separated from one another. The memory node layer not having the nano-sized elements may be a dielectric layer, e.g., a nitride layer, having a trap site with a predetermined density. The SONOS memory device may include a blocking oxide layer between the third memory node layer and the gate electrode.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
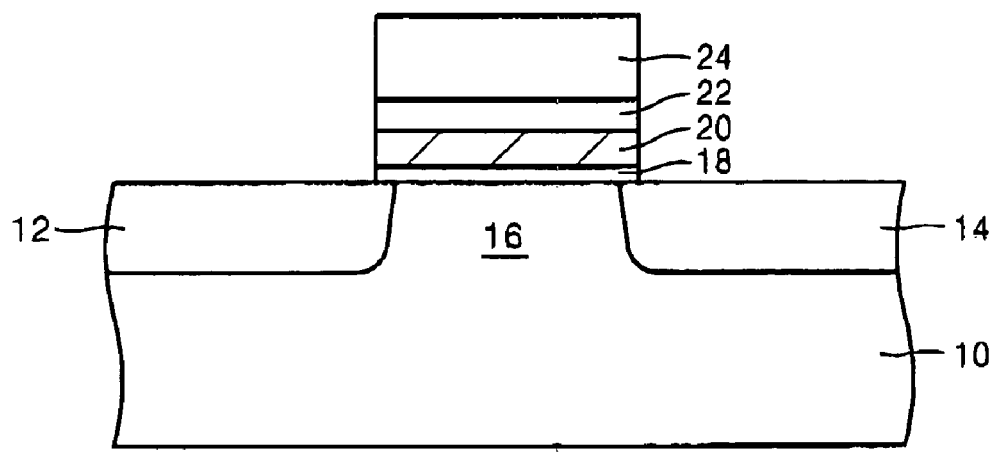
FIG. 1 illustrates a cross-section of a conventional SONOS memory device.

Korean Patent Application No. 2003-31909, filed on May 20, 2003, in the Korean Intellectual Property Office, and entitled "SONOS Memory Device Having Nanocrystal Layer," is incorporated herein by reference in its entirety.

A SONOS memory device according to the present invention will now be described more fully with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A SONOS memory device according to a first embodiment of the present invention will now be described with reference to FIG. 2.

Figure 2:
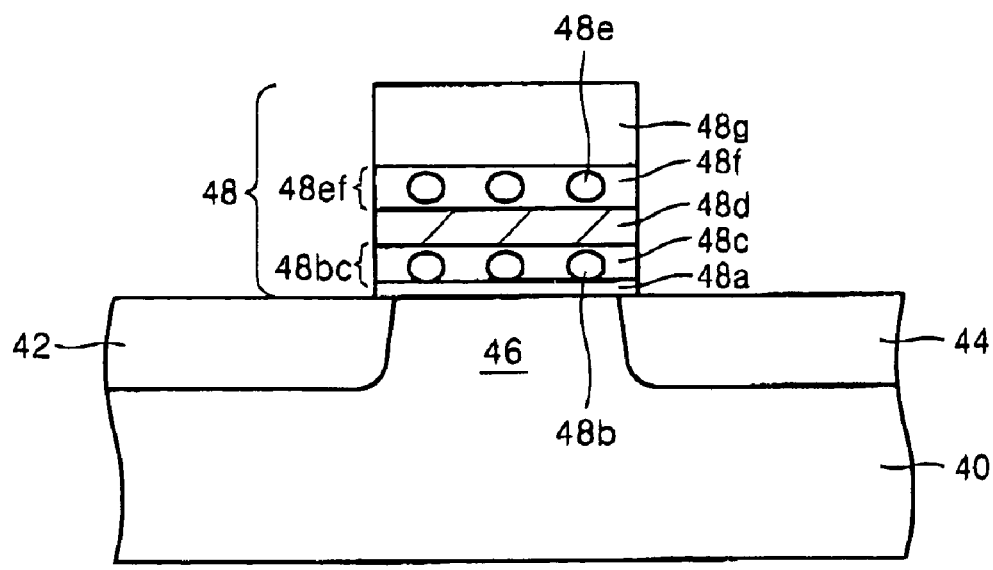
FIG. 2 illustrates a cross-section of a SONOS memory device having a nanocrystal layer according to a first embodiment of the present invention.

Referring to FIG. 2, the SONOS memory device according to the first embodiment of the present invention includes a p-type semiconductor substrate 40, which will be referred to as a semiconductor substrate. A source region 42 and a drain region 44 are formed in the semiconductor substrate 40 by injecting an n-type conductive impurity to a predetermined depth in the semiconductor substrate 40. A channel region 46 is formed between the source region 42 and the drain region 44. A first gate stacking material 48 is formed on the channel region 46 of the semiconductor substrate 40. Both edges of the bottom of the first gate stacking material 48 contact the source region 42 and the drain region 44.

The first gate stacking material 48 includes a first tunneling oxide layer 48a, a first memory node layer 48bc, a second memory node layer 48d, a third memory node layer 48ef, and a first gate electrode 48g that are sequentially stacked on the first tunneling oxide layer 48a. The first tunneling oxide layer 48a contacts the entire surface of the channel region 46 and portions of the source and drain regions 42 and 44, and may be a silicon oxide layer ($SiO_2$). The first memory node layer 48bc includes a first nano-trap layer 48b and a first insulating layer 48c. The first nano-trap layer 48b includes nano-sized trap elements, e.g., a plurality of nanocrystals spaced apart from one another, formed on the first tunneling oxide layer 48a. The first insulating layer 48c prevents the first nano-trap layer 48b from contacting the second memory node layer 48d, i.e., isolates the nano-trap layer from adjacent memory node layers. The second memory node layer 48d may be a dielectric layer, for example, a nitride layer ($Si_3N_4$), having a trap site of a predetermined density. The third memory node layer 48ef includes a second nano-trap layer 48e and a second insulating layer 48f. The second nano-trap layer 48e includes nano-sized trap elements, e.g., a plurality of nanocrystals. The second insulating layer 48f prevents the second nano-trap layer 48e from contacting the second memory node layer 48d and the gate electrode 48g, and prevents electrons trapped in the second nano-trap layer 48e from flowing to the gate electrode 48g. Accordingly, the second nano-trap layer 48e can be embedded in the second insulating layer 48f.

The first nano-trap layer 48b and the second nano-trap layer 48e of the first gate stacking layer 48 may be made of the same material. However, the first and the second nano-trap layers 48b and 48e may also be made of different nano-sized trap elements, e.g., different nanocrystals. The first insulating layer 48c may be a silicon oxide layer or another insulating material. The second insulating layer 48f, which is a blocking insulating layer for blocking the flow of electrons to the first gate electrode 48g, may be a silicon oxide layer or another insulating material.

In FIG. 2, the first memory node layer 48bc may be replaced with a trapping layer such as a silicon nitride layer ($Si_3N_4$) or a layer having a high dielectric constant (so called "high k") and an insulating layer that are sequentially stacked on the tunneling oxide layer 48a. Also, the third memory node layer 48ef may be replaced with an insulating layer, a trapping layer such as a silicon nitride layer ($Si_3N_4$) or the high k layer, and an insulating layer that are sequentially stacked on the second memory node layer 48d. Also, the first gate stacking layer 48 may include only the first and second memory nodes 48bc and 48d or the second and third memory nodes 48d and 48ef.

A SONOS memory device according to a second embodiment of the present invention will now be described with reference to FIG. 3. The same reference numerals used in FIG. 2 will be used for the same elements in FIG. 3.

Figure 3:
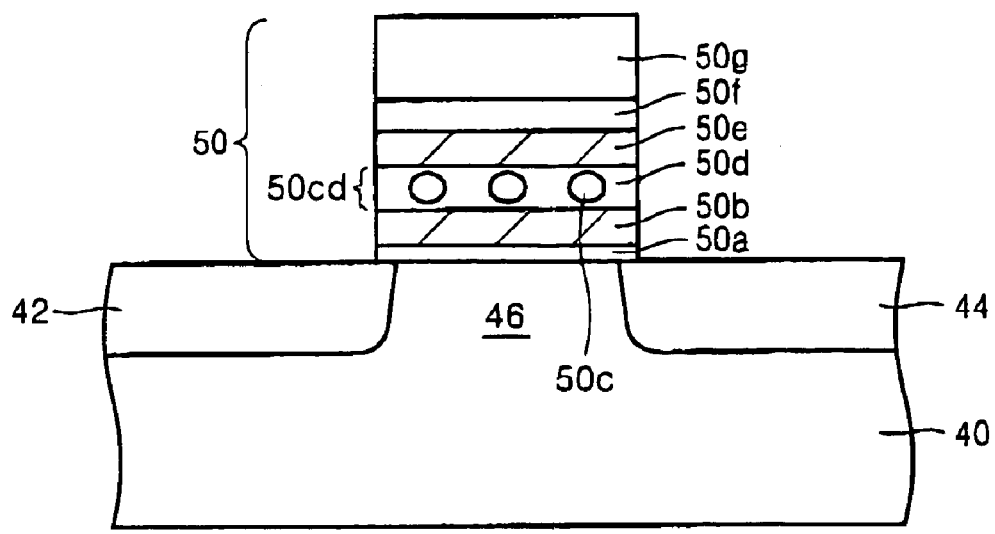
FIG. 3 illustrates a cross-section of a SONOS memory device having a nanocrystal layer according to a second embodiment of the present invention.

Referring to FIG. 3, the source region 42 and the drain region 44 are again formed at both sides of the channel region 46 in the semiconductor substrate 40. A gate stacking material 50 is formed on the channel region 46 of the semiconductor substrate 40. The gate stacking material 50 includes the tunneling oxide layer 50a, a first memory node layer 50b, a second memory node layer 50cd, a third memory node layer 50e, a blocking oxide layer 50f, and a gate electrode 50g, stacked sequentially. The tunneling oxide layer 50a is the same as the first tunneling oxide layer 48a of the first embodiment. The gate electrode layer 50g may be the same as the gate electrode layer 48g of the first embodiment. The blocking oxide layer 50f is the same as the blocking oxide layer 22 in the conventional art of FIG. 1.

The first memory node layer 50b may be a dielectric layer, for example, a nitride layer ($Si_3N_4$), having a trap site of a predetermined density. Electrons passing through the tunneling oxide layer 50a are trapped in the first memory node layer 50b. The second memory node layer 50cd is the same as the third memory node layer 48ef of the first embodiment. In other words, the memory node layer 50cd includes a nano-trap layer 50c and an insulating layer 50d. The nano-trap layer 50c may include nanocrystals that are separated from one another. The insulating layer 50d encompasses the nano-trap layer 50c and prevents the nano-trap layer 50c from contacting the memory node layers 50b and 50e, i.e., isolates the nano-trap layer from adjacent memory node layers. The fourth memory node layer 50e may be a dielectric layer, for example, a nitride layer, having a trap site of a predetermined density.

Trapping electrons in the memory node layers changes the threshold voltages of the SONOS memory devices according to the first and second embodiments of the present invention. The changes in the threshold voltage of the SONOS memory device will be described below with reference to the SONOS memory device according to the first embodiment of the present invention.

Figure 4:
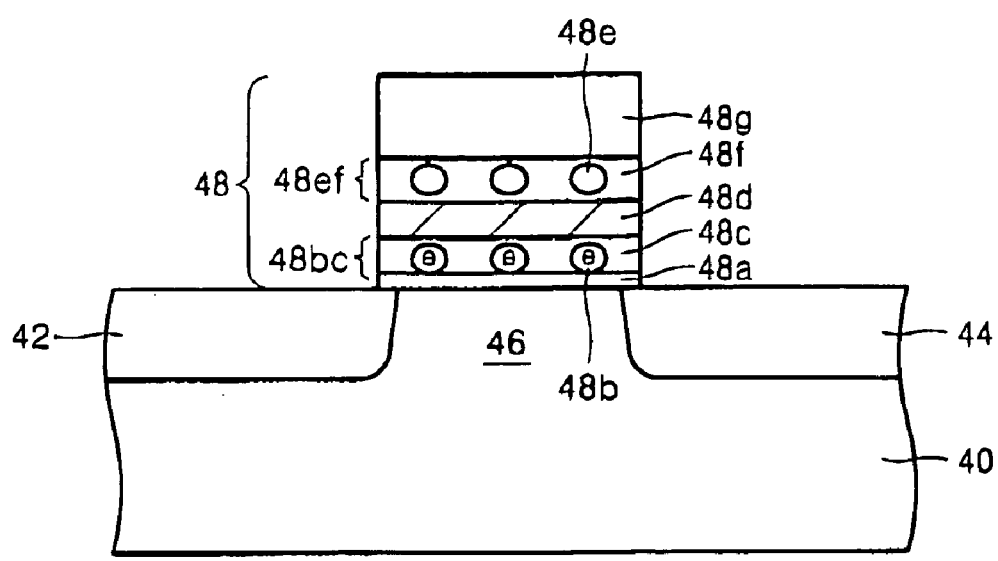
FIG. 4 illustrates a cross-section when carriers are trapped in a first memory node layer of the SONOS memory device of FIG. 2.
Figure 5:
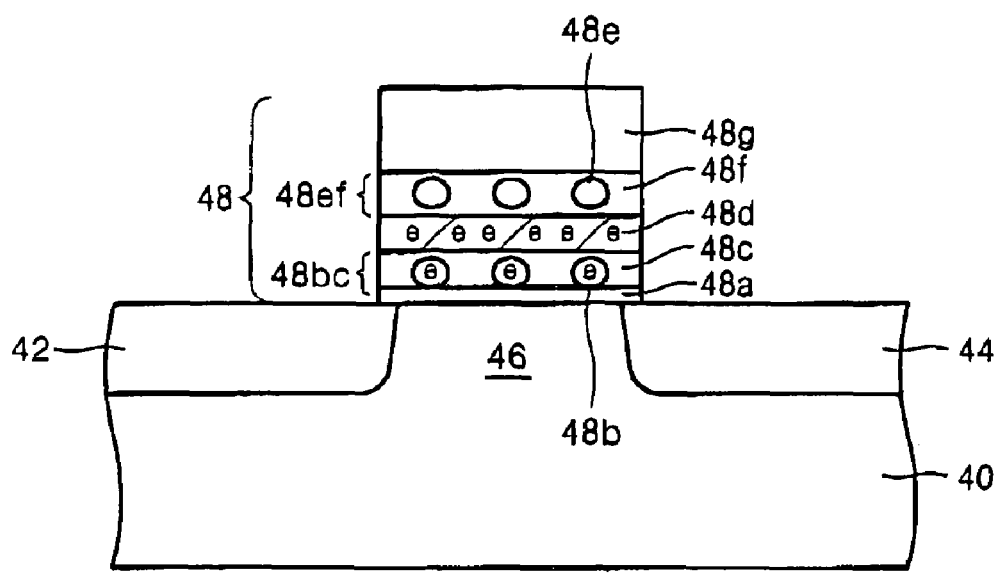
FIG. 5 illustrates a cross-section when carriers are trapped in first and second memory node layers of the SONOS memory device of FIG. 2.
Figure 6:
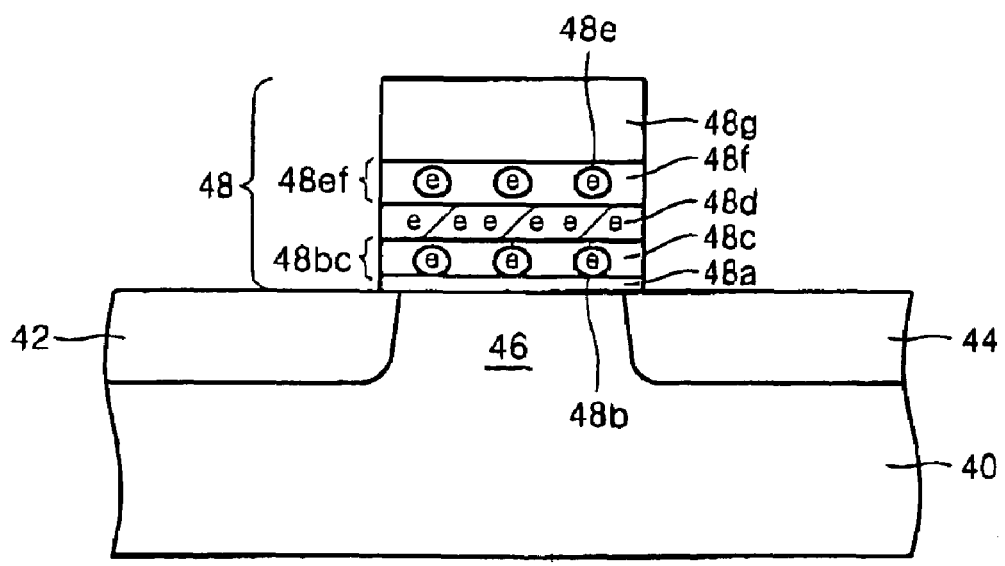
FIG. 6 illustrates a cross-section when carriers are trapped in first through third memory node layers of the SONOS memory device of FIG. 2.

FIG. 4 illustrates a cross-section of a first case where electrons e are trapped in the first memory node layer 48bc. FIG. 5 illustrates a cross-section of a second case where the electrons e are trapped in the first memory node layer 48bc and the second memory node layer 48d. FIG. 6 illustrates a cross-section of a third case where the electrons e are trapped in the first through third memory node layers 48bc, 48d and 48ef.

Figure 7:
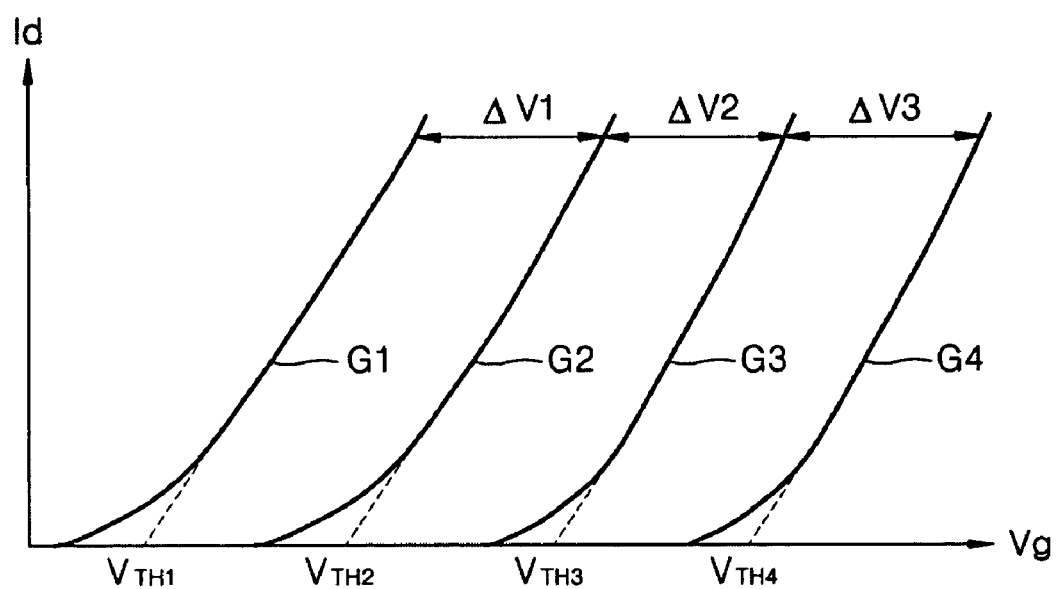
FIG. 7 is a graph illustrating the shifts of a threshold voltage by trapping carriers in memory node layers of the SONOS memory device of FIG. 2.

FIG. 7 is a graph illustrating the threshold voltage shift of the SONOS memory device according to the first through third cases. Reference character G1 of FIG. 7 denotes the threshold voltage in the case where no electrons e are trapped. Reference characters G2 through G4 of FIG. 7 respectively denote the threshold voltages in the first through third cases.

Referring to FIG. 7, the threshold voltage $V_{TH2}$ of the SONOS memory device in the first case is obtained by shifting the threshold voltage $V_{TH1}$ in the case where the electrons are not trapped in the memory node layers by $\Delta V1$. In addition, the threshold voltage $V_{TH3}$ of the SONOS memory device in the second case is obtained by shifting the threshold voltage $V_{TH2}$ in the first case by $\Delta V2$. In addition, the threshold voltage $V_{TH4}$ of the SONOS memory device in the third case is obtained by shifting the threshold voltage $V_{TH3}$ in the second case by $\Delta V3$.

Since the SONOS memory device according to the first embodiment of the present invention includes four different states according to the trapped states of the electrons, one SONOS memory device may store two-bits of data, for example, "00," "01," "10," or "11." Accordingly, the integration of the SONOS memory device according to the first embodiment of the present invention has more than twice the integration of a conventional SONOS memory device. The second embodiment of the present invention would analogously have twice the integration of a conventional SONOS memory device.

As described above, the SONOS memory device according to the present invention includes first through third memory node layers, wherein at least one memory node layer includes a nano-trap layer, e.g., including nanocrystals. Accordingly, the SONOS memory device according to the present invention may have four different states corresponding to two bits of data in one memory cell and the integration of the memory device is almost double the integration of a conventional SONOS memory device in which one bit is recorded in one memory cell.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A silicon-oxide-nitride-oxide-silicon (SONOS) memory device including a memory type transistor in which a gate is formed with a SONOS structure on a semiconductor substrate, wherein the gate comprises:
    a tunneling oxide layer;
    a memory node structure formed on the tunneling oxide layer and having a trap site in which charges passing through the tunneling oxide layer are trapped, the memory node structure including crystal layers having nanocrystals that are separated from one another to trap the charges; and
    a gate electrode formed on the memory node structure, wherein the memory node structure comprises:
    a first memory node layer, including a first crystal layer and a first insulating layer, the first crystal layer being isolated from the second memory node layer;

a second memory node layer, including a dielectric layer having a trap site with a predetermined density; and a third memory node layer, including a second crystal layer and a second insulating layer, the second crystal layer being isolated from the second memory node layer and the gate electrode.

2. The SONOS memory device as claimed in claim 1, wherein the dielectric layer is a nitride layer.

3. A silicon-oxide-nitride-oxide-silicon (SONOS) memory device including a memory type transistor in which a gate is formed with a SONOS structure on a semiconductor substrate, wherein the gate comprises:

a tunneling oxide layer;

a memory node structure formed on the tunneling oxide layer and having a trap site in which charges passing through the tunneling oxide layer are trapped, wherein the memory node structure includes nano-sized trap elements in which the charges are trapped; and a gate electrode formed on the memory node structure, wherein the memory node structure comprises:

a first memory node layer, including a first nano-sized trap element and a first insulating layer, the first nano-sized trap element being isolated from the second memory node layer;

a second memory node layer, including a dielectric layer having a trap site with a predetermined density; and a third memory node layer, including a second nano-sized trap element and a second insulating layer, the second nano-sized trap element being isolated from the second memory node layer and the gate electrode.

4. The SONOS memory device as claimed in claim 3, wherein the nano-sized trap element is a crystal layer composed of nanocrystals that are separated from one another.

5. The SONOS memory device as claimed in claim 3, wherein each of the first nano-sized trap element and the second nano-sized trap element is a crystal layer composed of nanocrystals that are separated from one another.

* * * * *